United States Patent
Fujino et al.

(10) Patent No.: US 6,897,740 B2
(45) Date of Patent: May 24, 2005

(54) DUPLEXER AND COMPOSITE MODULE HAVING A PACKAGE WITH AN ELECTROCONDUCTIVE LID ELECTRICALLY CONNECTED TO A SHIELD

(75) Inventors: Hiroyuki Fujino, Omihachiman (JP); Yoshihiko Gotoh, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 2 days.

(21) Appl. No.: 10/681,845

(22) Filed: Oct. 8, 2003

(65) Prior Publication Data

US 2004/0090287 A1 May 13, 2004

(30) Foreign Application Priority Data

Nov. 8, 2002 (JP) ........................................ 2002-325630
Sep. 3, 2003 (JP) ........................................ 2003-311206

(51) Int. Cl.[7] ............................ H03H 9/72; H03H 9/70; H03H 9/54; H03H 9/64
(52) U.S. Cl. ........................ 333/133; 333/126; 333/129; 333/132; 333/187; 333/193
(58) Field of Search .................................. 333/126, 129, 333/132–134, 187, 189, 193–196

(56) References Cited

U.S. PATENT DOCUMENTS 6,351,194 B2 * 2/2002 Takahashi et al. .......... 333/133
6,469,593 B2 * 10/2002 Nishizawa et al. ......... 333/133
6,700,061 B2 * 3/2004 Kishimoto ................. 174/52.4
6,714,099 B2 * 3/2004 Hikita et al. ................ 333/133

FOREIGN PATENT DOCUMENTS

| JP | 9-98046 | * | 4/1997 |
| JP | 9-181567 | | 7/1997 |
| JP | 2001-24476 | | 1/2001 |
| JP | 2002-198774 | | 7/2002 |

* cited by examiner

Primary Examiner—Barbara Summons
(74) Attorney, Agent, or Firm—Keating & Bennett LLP

(57) ABSTRACT

A duplexer includes a transmission band filter and a reception band filter connected in parallel to each other and connected to an antenna terminal. The transmission band filter and the reception band filter are accommodated in a package covered with an electroconductive lid. The package is mounted on a mounting substrate having the antenna terminal and covered with an electroconductive shield mounted on the mounting substrate. At least one of the transmission band filter and the reception band filter has a ground terminal connected to the lid. The lid is electrically connected to the shield.

18 Claims, 22 Drawing Sheets

DUPLEXER AND COMPOSITE MODULE HAVING A PACKAGE WITH AN ELECTROCONDUCTIVE LID ELECTRICALLY CONNECTED TO A SHIELD

BACKGROUND OF THE INVENTION

1. Field of the Invention

The present invention relates to a duplexer for use in a communication device or other suitable apparatus, the filter including a piezoelectric thin-film filter having a piezoelectric thin-film resonator or a surface acoustic wave filter having a surface acoustic wave resonator, and a composite module having at least one filter and a mounting member.

2. Description of the Related Art

Recently, surface acoustic wave filters using surface acoustic waves and piezoelectric thin-film filters using bulk acoustic waves have been developed.

Moreover, duplexers having the above-described surface acoustic wave filters and piezoelectric thin-film filters are disclosed in Japanese Unexamined Patent Application Publication No. 2001-24476 (Patent Document 1), Japanese Unexamined Patent Application Publication No. 9-181567 (Patent Document 2), and Japanese Unexamined Patent Application Publication No. 2002-198774 (Patent Document 3).

Patent Document 2 discloses a structure in which a filter contained in a package is mounted on a printed circuit board, and the filter is covered in a metallic case. In this structure, the metallic case is connected to the ground (GND) of the printed circuit board, so that the case functions as a shield.

Patent Document 3 discloses a structure in which a filter contained in a package is mounted on a printed circuit board, and the filter is covered in a metallic case, the metallic case being connected to the ground (GND) of a printed circuit board so as to function as a shield. An insulating material layer is provided between the package and the metallic case, so that the electrical connection between the package and the metallic case is prevented. This structure prevents changes in parasitic inductance, which may be caused, e.g., when the case is distorted, resulting in the partial connection between the package and the case. Thus, the filter characteristic is prevented from being deteriorated.

However, according to the above-described structure, the filter contained in the package is grounded by its connection to GND of the printed circuit board via a land in the package, a through-hole in the package, a GND terminal of the package, and a through-hole of the printed circuit board. Therefore, it is difficult to provide a wide area for the GND. Moreover, the through-hole is narrow. Therefore, the electromagnetic field interference between the filters and that between the filters and a matching circuit element are insufficiently prevented. Thus, problems occur in that satisfactory attenuation and insertion loss can not be achieved.

SUMMARY OF THE INVENTION

In order to overcome the problems described above, preferred embodiments of the present invention provide a duplexer that minimizes the electromagnetic field interference between filters provided therein so as to achieve excellent characteristics.

According to a first preferred embodiment of the present invention, a duplexer includes a transmission band filter and a reception band filter connected in parallel to each other and connected to an antenna terminal, the transmission band filter and the reception band filter being accommodated in a package covered with an electroconductive lid, the package being mounted on a mounting substrate having the antenna terminal and being covered with an electroconductive shield mounted on the mounting substrate, at least one of the transmission band filter and the reception band filter having a ground terminal connected to the lid, the lid being electrically connected to the shield via a connecting member, the transmission band filter and the reception band filter having ground terminals electrically connected to a ground terminal of the mounting substrate.

According to a second preferred embodiment of the present invention, a duplexer includes a transmission band filter and a reception band filter connected in parallel to each other and connected to an antenna terminal, the transmission band filter and the reception band filter being accommodated in separate packages sealed with an electroconductive lid, respectively, the package being mounted on a mounting substrate having the antenna terminal and being covered with an electroconductive shield mounted on the mounting substrate, at least one of the transmission band filter and the reception band filter having a ground terminal connected to the lid, the lid being electrically connected to the shield via a connecting member, the transmission band filter and the reception band filter having ground terminals electrically connected to a ground terminal of the mounting substrate.

With the unique structure described in the preceding paragraphs, the lid and the shield function as ground electrodes (GND) in addition to the ground electrode (GND) of the mounting substrate. Therefore, the number of routes for grounding at least one of the transmission band filter and the reception band filter is increased. Thus, the grounding is reliably achieved. Thereby, the electromagnetic field interference between the filters is effectively minimized. Thus, the duplexer has a sufficient isolation characteristic while the other characteristics of the duplexer are not deteriorated.

In the route extended to the ground (the ground electrode of a mounting substrate) of a known duplexer, a wiring is provided in a package, and moreover, a bump or solder for bonding a mounting substrate to the package exist, and a through-hole is formed in the mounting substrate, so that the parasitic inductance is large. On the other hand, according to the above-described constructions of preferred embodiments of the present invention, the lid functions as a ground electrode (GND). Thus, only the wiring exists in the package in the route extended to the ground (lid). Thus, the parasitic inductance is significantly decreased. Thereby, the characteristics of the duplexer are greatly improved.

In addition, the electromagnetic filed interference is minimized in the duplexer. Thus, when the duplexer is mounted in a communication device, the device can be operated with high stability.

Preferably, the shield is electrically connected to the ground terminal of the mounting substrate.

According to the above-described configuration, the shield can function as a GND electrode. Thus, it is possible to increase the area of the GND electrode. Therefore, the electromagnetic field interference between the filters is even more suppressed.

Preferably, the duplexer further includes a matching circuit provided between the antenna terminal and at least one of the transmission band filter and the reception band filter.

According to the above-described unique structure, the electromagnetic field interference between the matching circuit element and the filter is minimized. Moreover, even if the physical distance between the package and the matching circuit is decreased, the electromagnetic field interference can be minimized. The duplexer, even if it is provided with the matching circuit, can be greatly reduced in size.

Both of the ground terminals of the transmission band filter and the reception band filter may be connected to the lid.

Also, the transmission band filter and the reception band filter may be bulk acoustic wave filters, surface acoustic wave filters, or combinations thereof.

According to a third preferred embodiment of the present invention, a composite module includes at least one filter and a mounting member, the at least one filter being accommodated in at least one package sealed with an electroconductive lid, the package being mounted on and joined to a mounting substrate, and the at least one filter having a ground terminal connected to the lid, the lid being electrically connected to the shield via a connecting member, and the ground terminal of the at least one filter being electrically connected to the ground terminal of the mounting substrate.

Other features, elements, characteristics and advantages of the present invention will become more apparent from the following detailed description of preferred embodiments with reference to the attached drawings.

DETAILED DESCRIPTION OF PREFERRED EMBODIMENTS

Hereinafter, preferred embodiments of the present invention will be described with reference to FIG. 1 to FIG. 18.

Figure 1:
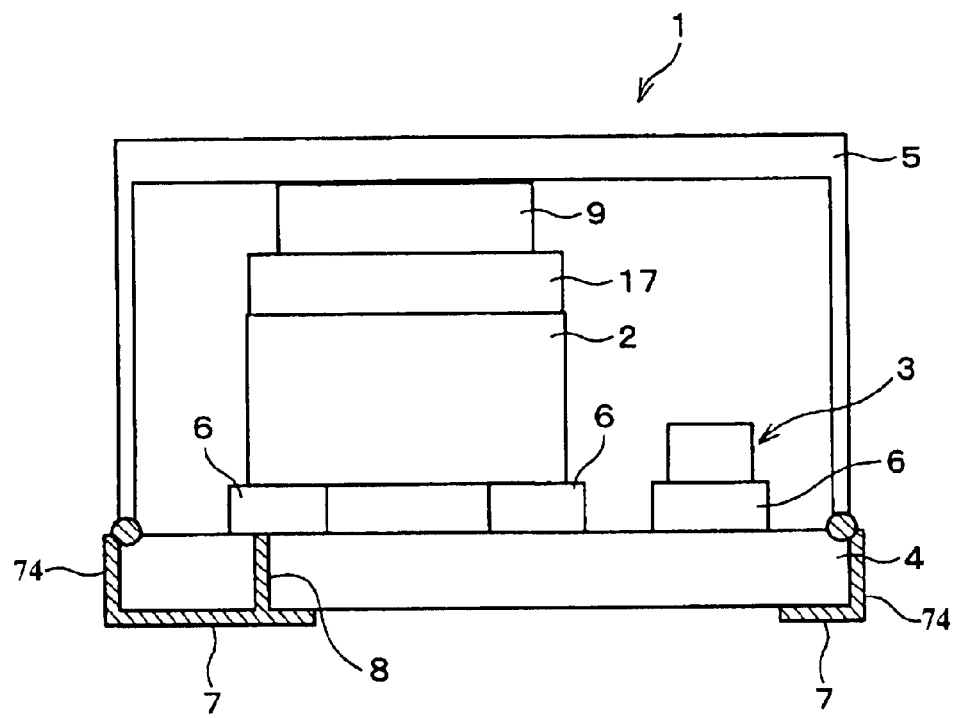
FIG. 1 is a cross-sectional view and a plan view of an essential portion of a duplexer according to a preferred embodiment of the present invention.
Figure 1:
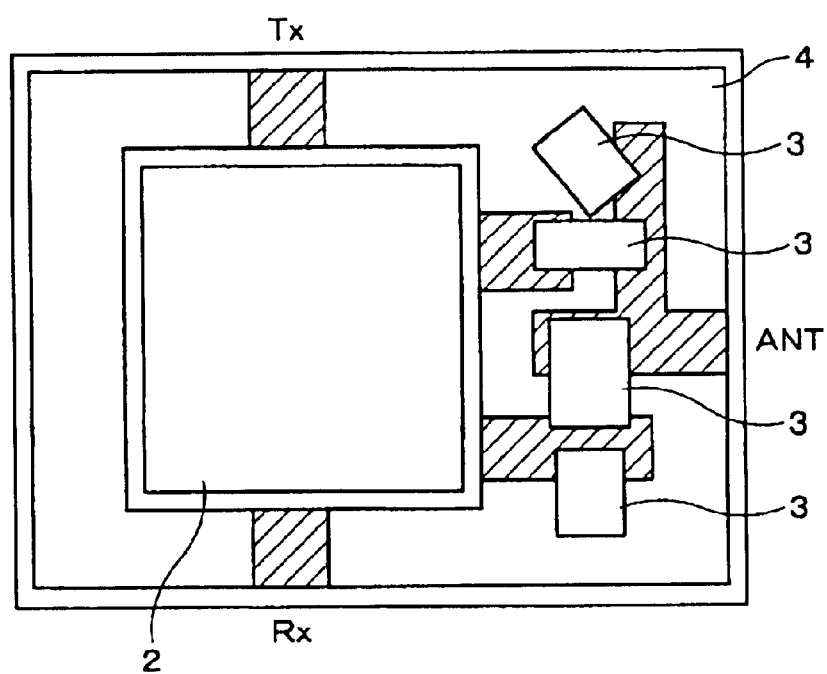

As shown in FIG. 1, a duplexer (duplexer) 1 according to a first preferred embodiment preferably includes a package 2 of which a transmission band filter and a reception band filter are sealed with a metallic lid 17, matching circuit elements 3 for matching the transmission band filter with the reception band filter, the matching circuit elements 3 preferably including an inductance (L), a capacitance (C), or other suitable element, a mounting substrate 4, and a metallic shield 5.

The package 2 and the matching circuit elements 3 are preferably mounted on the same surface of the mounting substrate 4. In particular, wirings for mounting the package 2 and the matching circuit elements 3 are provided on the upper surface of the mounting substrate 4. The wirings disposed on the mounting substrate 4 are provided with a transmission terminal (Tx), a reception terminal (Rx), an antenna terminal (ANT), and a GND terminal for the mounting substrate (hereinafter, referred to as a mounting substrate GND). The transmission band filter and the reception band filter contained in the package 2, and the matching circuit elements 3 are connected via bonding members 6 such as solder, a conductive adhesive, or other suitable members or material, to the wirings provided on the mounting substrate 4.

The package 2 is provided with GND (hereinafter, referred to as a package GND). GND terminals of the transmission band filter and the reception band filter are connected to the package GND. The package GND is connected via the bonding member 6 such as solder, a conductive adhesive, or other suitable material, to the mounting substrate GND terminal 7 provided on the mounting substrate 4. GND terminals of the matching circuit elements 3 are connected to the mounting substrate GND terminal 7.

The above-described mounting substrate GND terminal is connected via a through-hole 8 to the mounting substrate GND pattern 7 provided on the surface of the mounting substrate 4 where the package 2 and the matching circuit elements 3 are not mounted.

The shield 5 is fixed to the mounting substrate 4 so as to cover the package 2 and the matching circuit elements 3. Moreover, the shield 5 is connected to the mounting substrate GND 7 via a castellated member 74.

The package GND is also connected to the lid 17. The lid 17 is connected to the shield 5 via a connecting member 9.

Figure 2A:
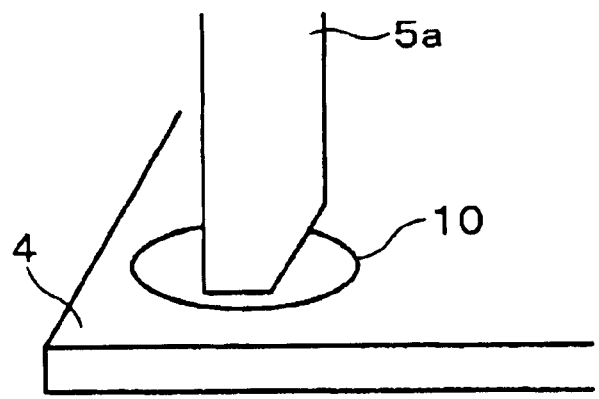
FIGS. 2A and 2B illustrate a method of fixing a shield in the duplexer according to a preferred embodiment of the present invention.
Figure 2B:
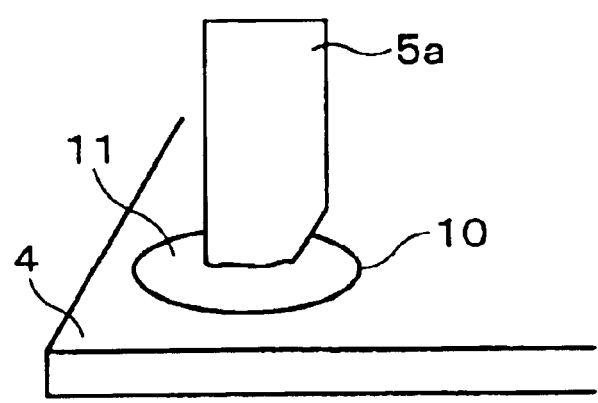

Referring to a method of fixing the shield 5 to the mounting substrate 4, for example, plural legs 5a are provided on the shield 5, and are inserted into through-holes formed in the mounting substrate 4, as shown in FIG. 2A. The legs 5a may be simply inserted into the through-holes 10. In the case in which the legs 5a are inserted, the shield 5 can not be connected to other members. Moreover, as shown in FIG. 2B, the legs 5a may be bonded to the through-holes 10 via a bonding member 11 such as solder, a conductive adhesive, or other suitable member or material. Moreover, the legs 5a may be connected to the mounting substrate GND 7 via the through-holes 10. If no connection of the shield 5 to the mounting substrate GND 7 is required, an insulating adhesive may be used.

Hereinafter, the package 2 to be mounted on the mounting substrate 4 will be described with reference to FIGS. 3A, 3B, 4A, and 4B.

Figure 3A:
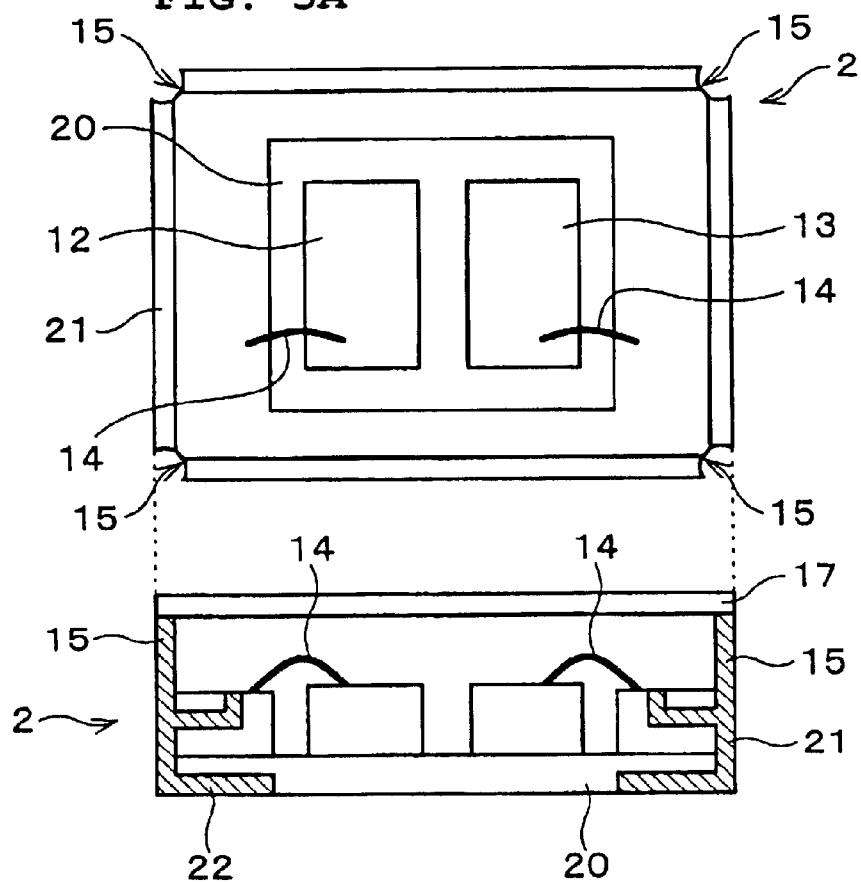
FIG. 3A is a plan view showing the structure of a package in the duplexer, and a cross-sectional view of an essential portion of the duplexer according to a preferred embodiment of the present invention.
Figure 3B:
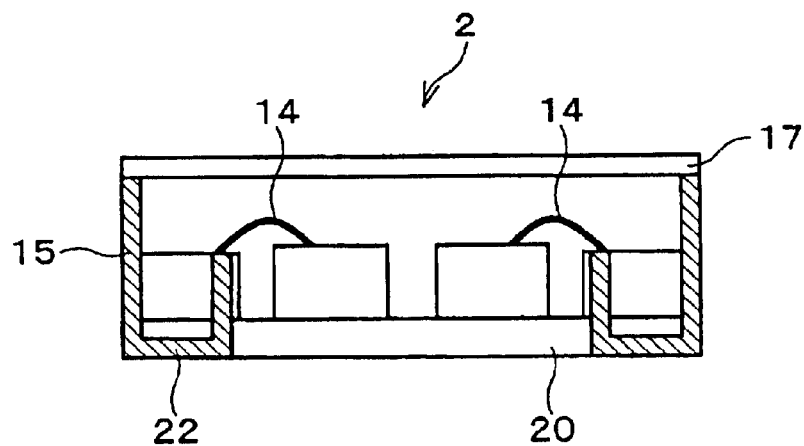
FIG. 3B is a cross-sectional view of the essential portion of the package according to a preferred embodiment of the present invention.

As shown in FIGS. 3A and 3B, the package 2 preferably has a substantially rectangular shape with an opening. The package 2 includes a substantially rectangular bottom plate 20, and side plates 21 arranged on the four sides of the bottom plate 20 so as to extend upright thereon. A transmission band filter 12 and a reception band filter 13 are mounted on the bottom plate 20 in the package 2. The opening is covered and closed by the lid 17. The transmission band filter 12 and the reception band filter 13 are provided with GND terminals, respectively. These GND terminals are connected via wires 14 to in-package GNDs, respectively. A castellation 15 is provided in the side plates 21. The in-package GNDs, package GND terminals 22 provided in the bottom plate 20, and the lid 17 are all connected to the castellation 15. The in-package GNDs are not restricted to the above-described structure. For example, the in-package GNDs may be connected to the package GND terminals 22, respectively, as shown in FIG. 3B.

Figure 4A:
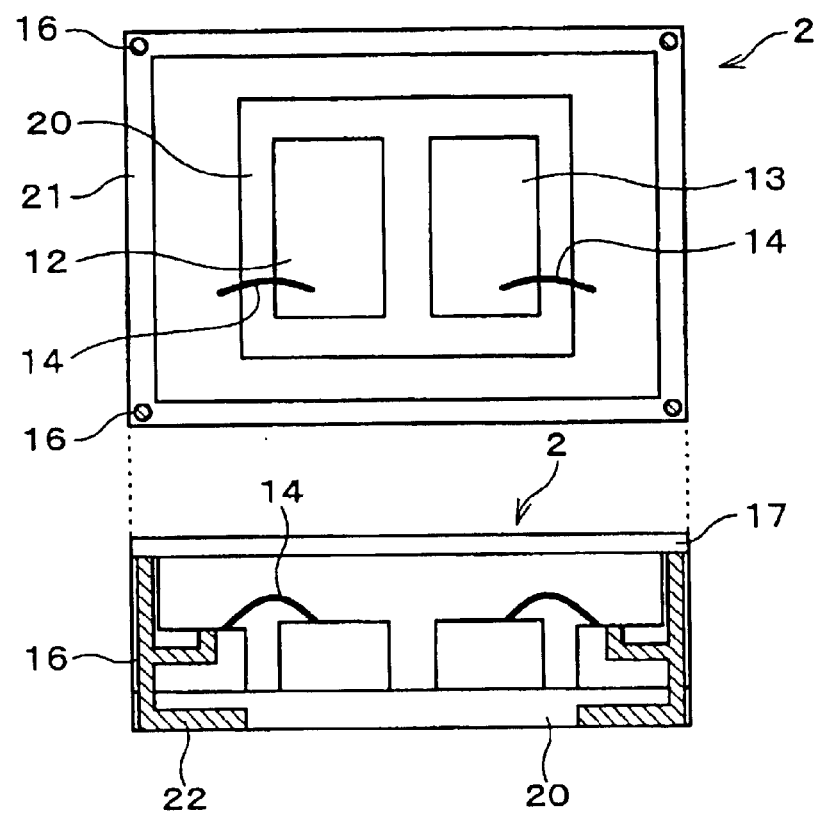
FIG. 4A is a plan view and a cross-sectional view which show the structure of a modification of the package in the duplexer according to a preferred embodiment of the present invention.
Figure 4B:
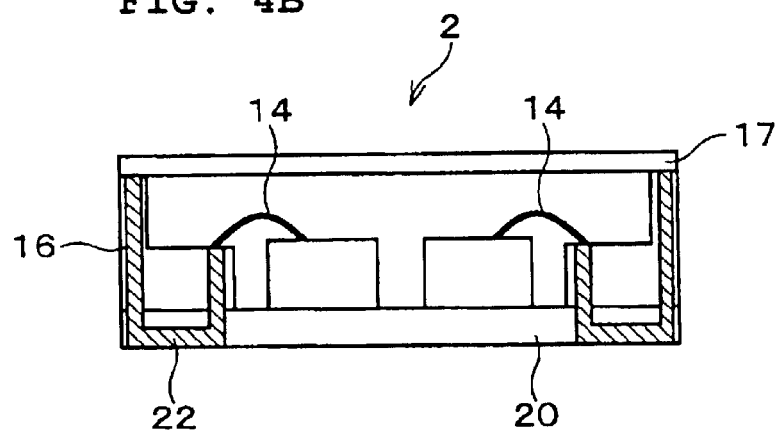
FIG. 4B is a cross-sectional view of the essential portion of a modification of the duplexer according to a preferred embodiment of the present invention.

Moreover, as shown in FIGS. 4A and 4B, through-holes 16 may be formed in the side plates 21 instead of the castellation 15. The package GNDs include the in-package GNDs and the package GND terminals.

Figure 5:
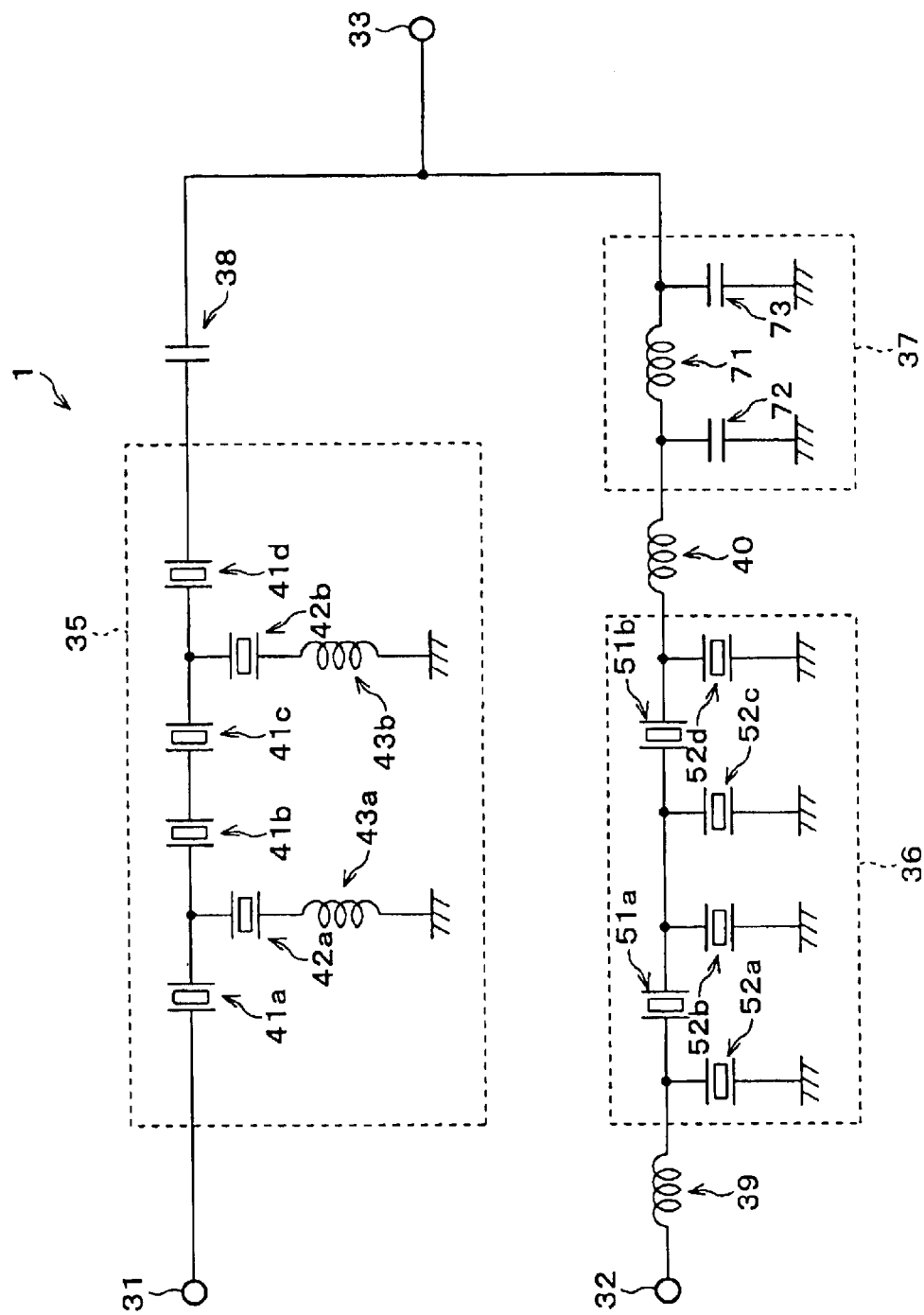
FIG. 5 is a circuit diagram of the duplexer according to a preferred embodiment of the present invention.

Hereinafter, an example of the circuit of the duplexer 1 will be described. The duplexer 1 preferably includes a transmission terminal 31, a reception terminal 32, and an antenna terminal 33, as shown in FIG. 5. The duplexer 1 further includes a transmission band filter 35 (transmission band filter 12) disposed between the antenna terminal 33 and the transmission terminal 31, a reception band filter 36 (reception band filter 13) disposed between the antenna 33 and the reception terminal 32, and a matching circuit element 37 (matching circuit element 3) disposed between the antenna terminal 33 and the reception filter 36. That is, in the example of the duplexer, the parallel combination of the transmission band filter 35 and the reception band filter 36 is connected to the antenna terminal 33. A capacitance 38 (matching circuit element 3) is provided between the antenna terminal 33 and the transmission band filter 35. Inductances 39 and 40 (matching circuit elements 3) are provided between the reception terminal 32 and the reception band filter 36 and between the reception band filter 36 and the matching circuit 37, respectively. The pass-bands of the transmission band filter 35 and the reception band filter 36 are set so as to be different from each other.

The transmission band filter 35 includes series-connected resonators 41a to 41d and parallel-connected resonators 42a and 42b arranged in a ladder configuration. The parallel-connected resonators 42a and 42b are grounded via inductances 43a and 43b, respectively.

The reception band filter 36 includes series-connected resonators 51a and 51b and parallel-connected resonators 52a to 52d arranged in a ladder configuration. The parallel-connected resonators 52a to 52d are grounded.

The matching circuit element 37 includes a series-connected inductance 71 and parallel-connected capacitances 72 and 73. The capacitances 72 and 73 are grounded.

According to the above-described structure, the package GND terminals of the package 2 including the transmission band filter and the reception band filter are connected to the shield 5 via the lid 17. Thereby, the shield 5 can be used as a ground. Moreover, the lid functions as a ground. Furthermore, the GND terminals of the respective filters are connected to the package GND terminals, respectively. Therefore, the area of the GND of each filter can be increased closely to the filter. Thus, the electromagnetic field interference between the respective filters and that between the respective filters (package 2) and the matching circuit element 3 is minimized. Accordingly, even if the physical distance between the package 2 and the matching circuit element 3 is decreased, the electromagnetic field interference can be reduced. Therefore, the size of the duplexer can be decreased. When the duplexer is mounted in a communication device, the communication device can be stably operated, due to the suppression of the electromagnetic field interference.

Moreover, the package GND terminals and the GND terminals of the matching circuit elements 3 are connected to the mounting substrate GNDs 7 via the through-holes or other suitable elements. The mounting substrate GNDs 7 are connected to the shield 5 via the castellation, the through-holes, or other suitable elements formed in the mounting substrate 4. Therefore, the areas of the GNDs of the respective filters and the matching circuit elements 3 can be increased. Thus, the electromagnetic field interference between the respective filters and that between the respective filters (package 2) and the matching circuit elements 3 can be even more suppressed.

Figure 6:
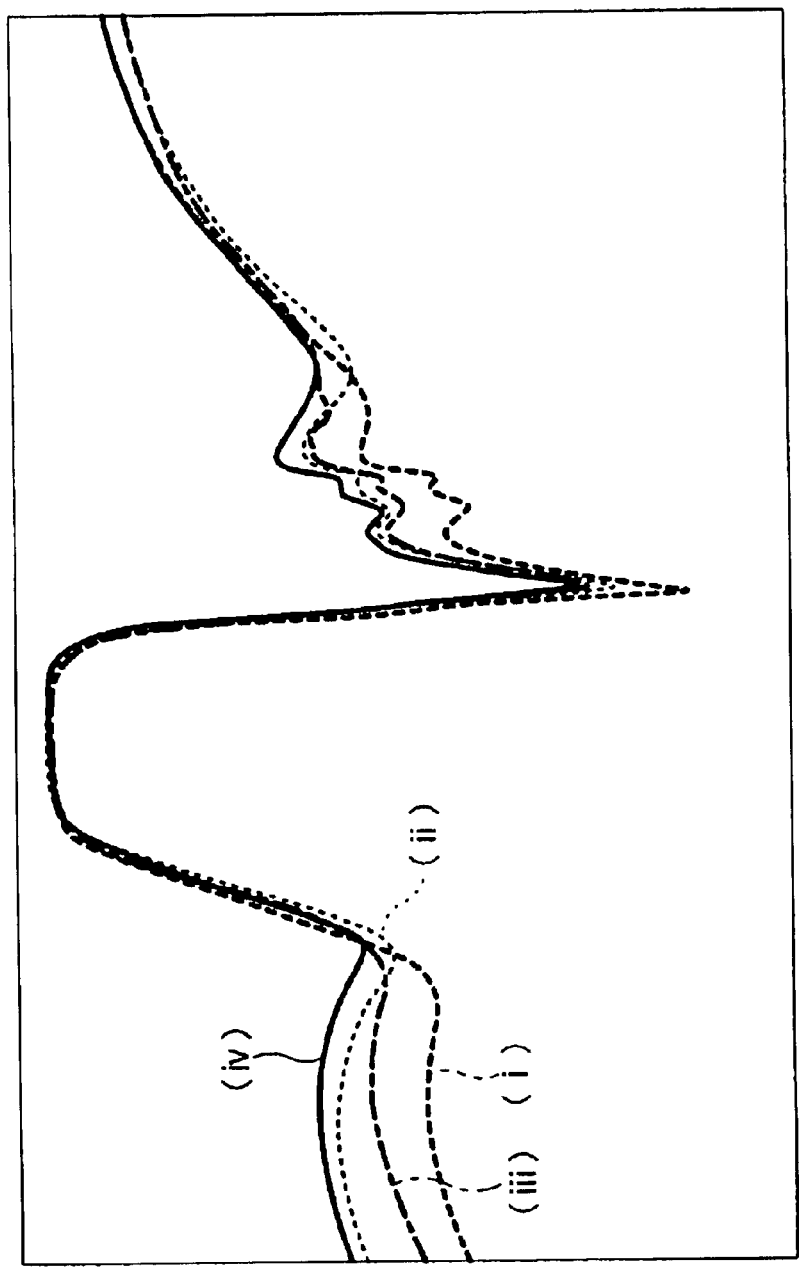
FIG. 6 is a graph showing the characteristics of the duplexer according to a preferred embodiment of the present invention in which the connection position with respect to the shield is changed.

The characteristic of the duplexer 1 was measured. FIG. 6 graphically shows the measurement results. In the graph, curve (i) shows the characteristic obtained when the shield 5, the lid 17, and the mounting substrate GNDs 7 are electrically connected. Curve (ii) shows the characteristic obtained when the shield 5 and the lid 17 are electrically connected, but the shield 5 and the mounting substrate GNDs 7 are not electrically connected (that is, insulated). Curve (iii) shows the characteristic obtained when the shield 5 and the lid 17 are not electrically connected (insulated), but the shield 5 and the mounting substrate GNDs 7 are electrically connected. Curve (iv) shows the characteristic obtained when the shield 5, the lid 17, and the mounting substrate GNDs are not connected (insulated). As seen in the graph, the attenuation of the duplexer can be enhanced by increasing the number of electrical connection points with respect to the shield 5. In particular, regarding the route from the respective filters (package 2) to the package substrate GNDs, the route via the lid of the package and the shield electrically connected to the lid is added to the route via the package GND terminal, and thereby, the characteristic of the duplexer is enhanced.

The shield 5 is fixed to the mounting substrate 4, e.g., preferably by use of an insulating resin or an electroconductive resin (e.g., an epoxy resin including a conductive filler or other suitable material), or solder (Sn, Cu, Ag or other suitable material). The adhesive has no particular limitation. The resins may be insulating or conductive and may be any material that is effective in fixing the shield 5 to the mounting substrate 4.

The shield 5 is not restricted to a metallic one. The shield 5 may be formed of an insulating member or material, or may be formed of a metal of which the surface is wholly or partially coated with a metal by a film-forming method such as plating, sputtering, vapor-deposition, or other suitable process, or may be formed of an insulating member of which the inside is wholly or partially made of metal (e.g., an insulating piece including a GND pattern to be connected to the respective filters).

Figure 7:
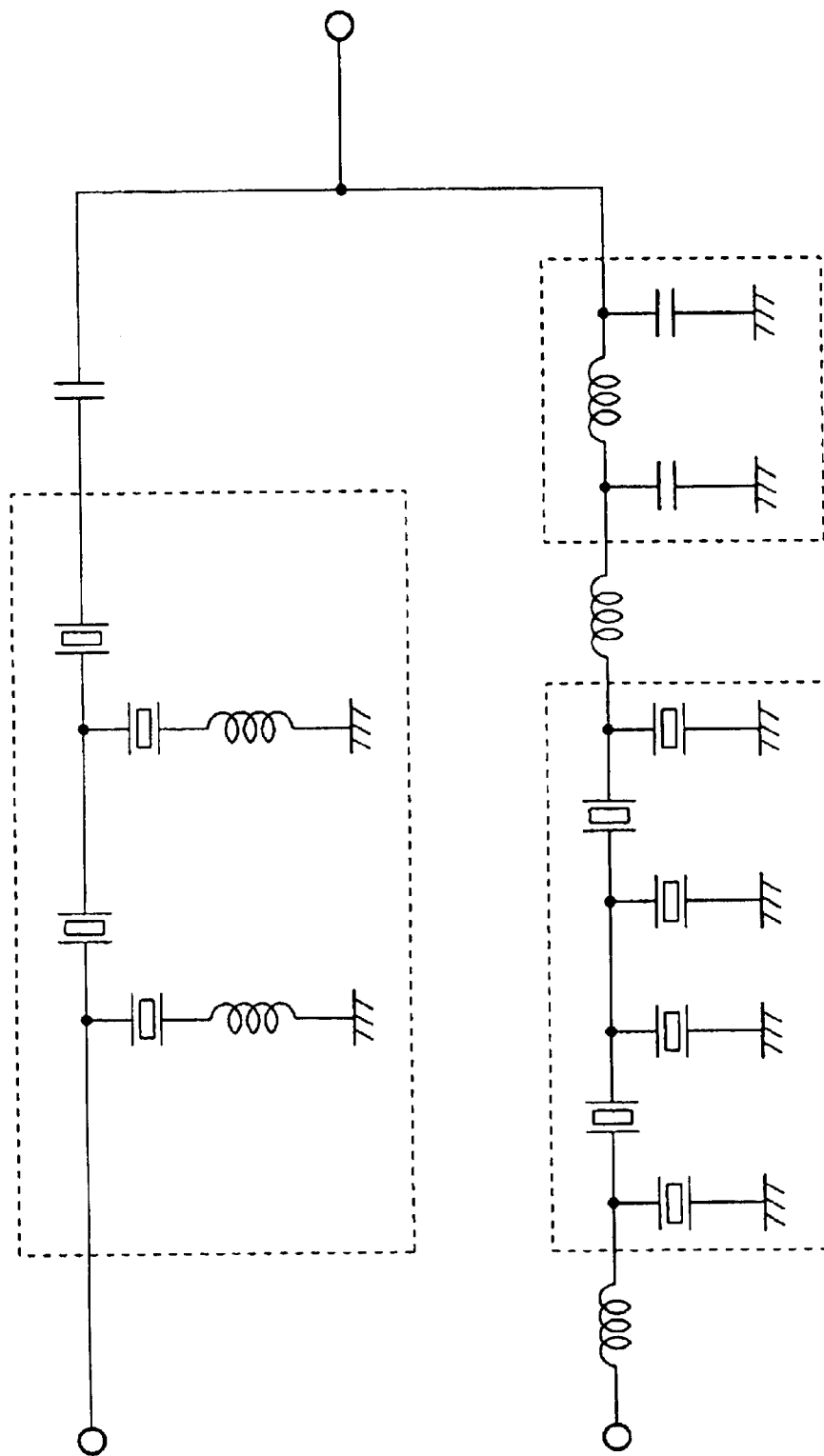
FIG. 7 is a circuit diagram of a modification of the duplexer according to a preferred embodiment of the present invention.
Figure 8:
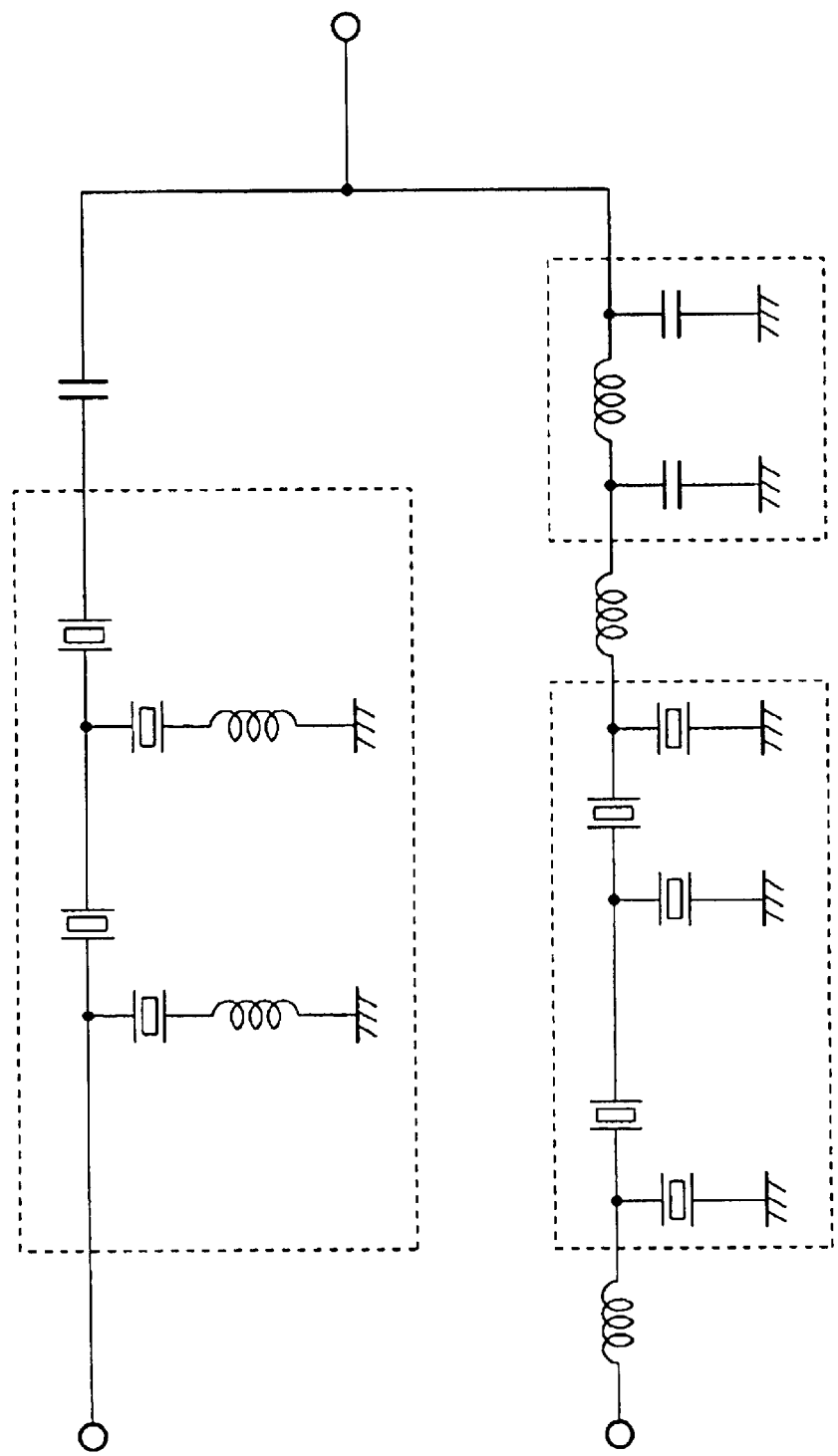
FIG. 8 is a circuit diagram of another modification of the duplexer according to a preferred embodiment of the present invention.
Figure 9:
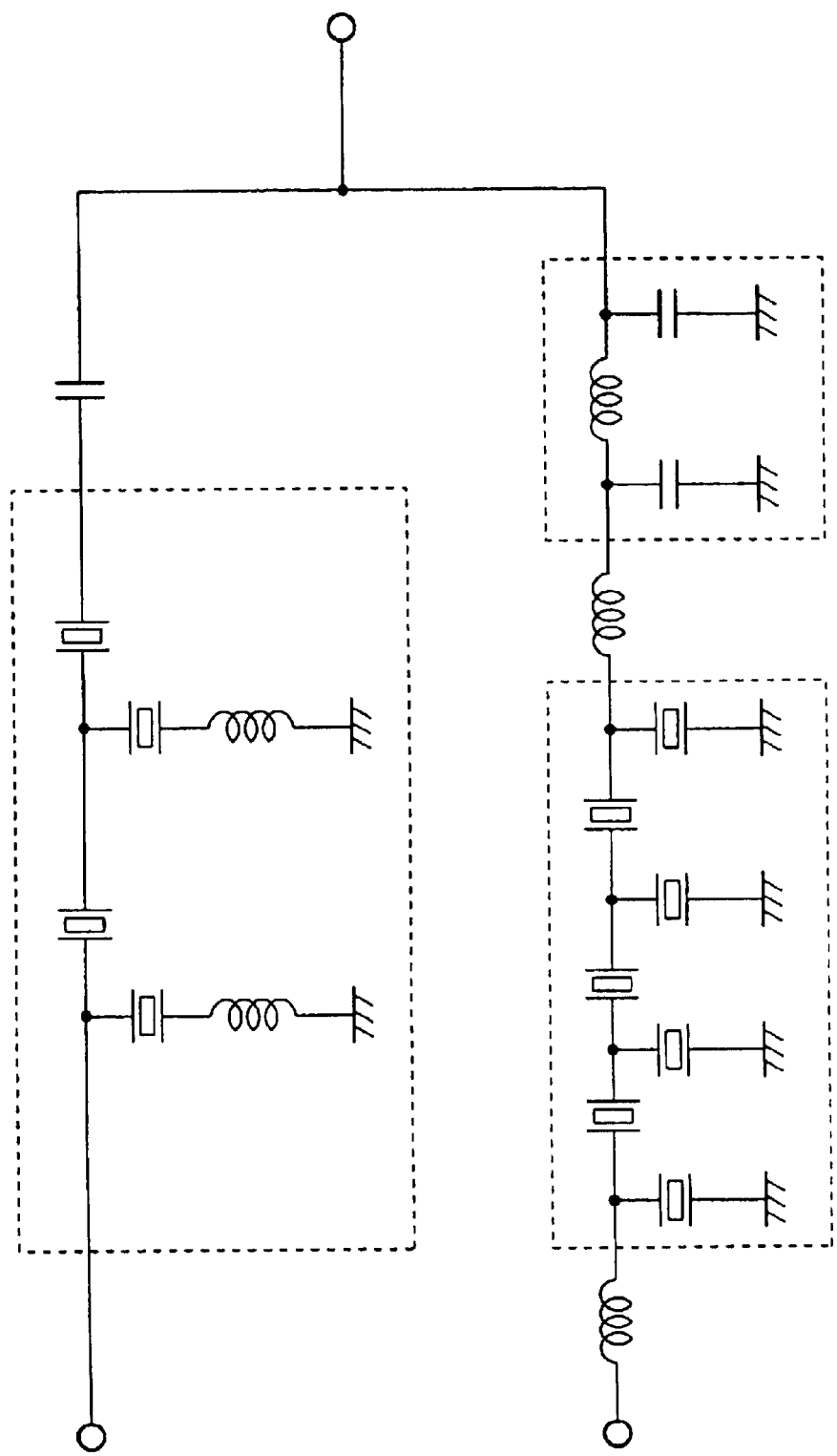
FIG. 9 is a circuit diagram of still another modification of the duplexer according to a preferred embodiment of the present invention.

FIGS. 7 to 9 show modifications of the circuit of the duplexer. The circuit shown in FIG. 7 is the same as that of FIG. 5 except that the series-connected resonators 41a and 41b of the transmission band filter 35 are removed. The circuit of FIG. 8 is the same as that of FIG. 7 except that the parallel-connected resonator 52b of the reception band filter 36 is removed. The circuit shown in FIG. 9 is the same as that of FIG. 7 except that a series-connected resonator is added between the parallel-connected resonator 52b and the parallel-connected resonator 52c of the reception band filter 36. With these circuit-configurations, the same advantages as those of the circuit-configuration of FIG. 5 can be obtained.

The configuration of each matching circuit element 3 has no particular limitation. The matching circuit element may be omitted as desired. Moreover, the matching circuit elements 3 may be incorporated in the reception band filter.

As the transmission band filter 35 and the reception band filter 36, a bulk acoustic wave filter may be used, which includes bulk acoustic wave resonators (piezoelectric thin-film resonators) as the series-connected resonators and the parallel-connected resonators. Also, a surface acoustic wave filter and a longitudinally-coupled resonator type surface acoustic wave filter each including surface acoustic wave resonators as the parallel-connected and series-connected resonators may be used. Furthermore, a combination of the bulk acoustic wave filter and the surface acoustic wave filter may be used for transmission and reception.

Figure 10:
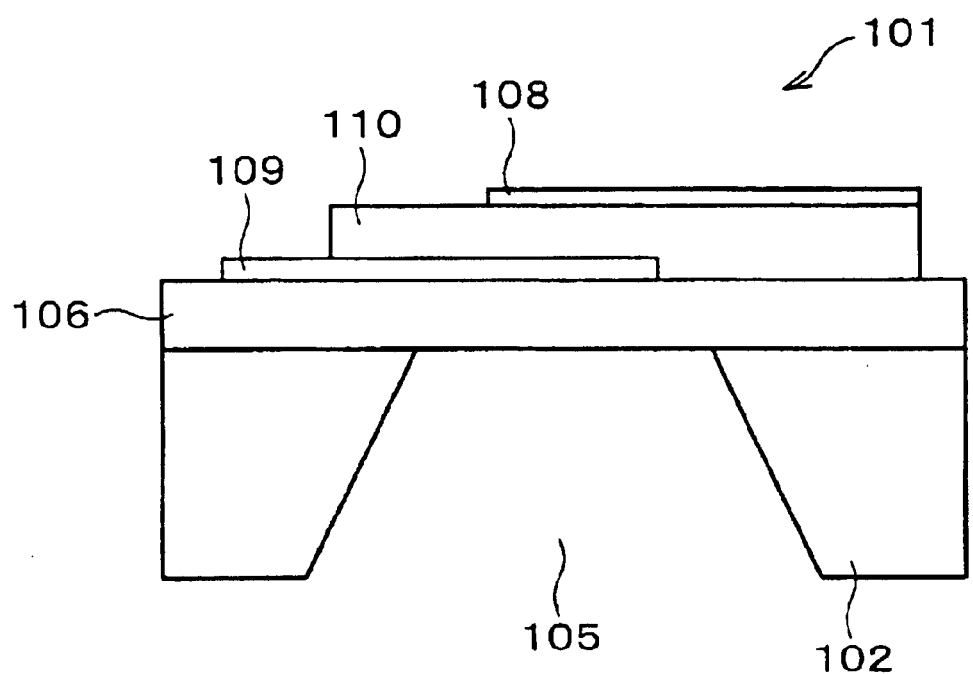
FIG. 10 is a cross-sectional view of an essential portion of a bulk acoustic wave resonator (piezoelectric thin-film resonator) for use in the duplexer according to a preferred embodiment of the present invention.

The bulk acoustic wave resonator (piezoelectric thin-film resonator) of the bulk acoustic wave filter used as the transmission band filter preferably has, e.g., the structure shown in FIG. 10. As shown in FIG. 10, a bulk acoustic wave resonator (piezoelectric thin-film resonator) 101 preferably includes a Si substrate 102, and an insulating film 106 of $SiO_2$, $SiO_2/Al_2O_3$, or $Al_2O_3/SiO_2$ formed on the Si substrate 102. Moreover, the Si substrate 102 has an opening 105, which passes through the Si substrate 102 in the thickness direction thereof to reach the insulating film 106. Moreover, a lower electrode 109 made of Al or other suitable material, a piezoelectric thin-film 110 made of ZnO, AlN or other suitable material, and an upper electrode 108 made of Al or other suitable material are preferably formed on the insulating film 106 in that order.

Figure 11:
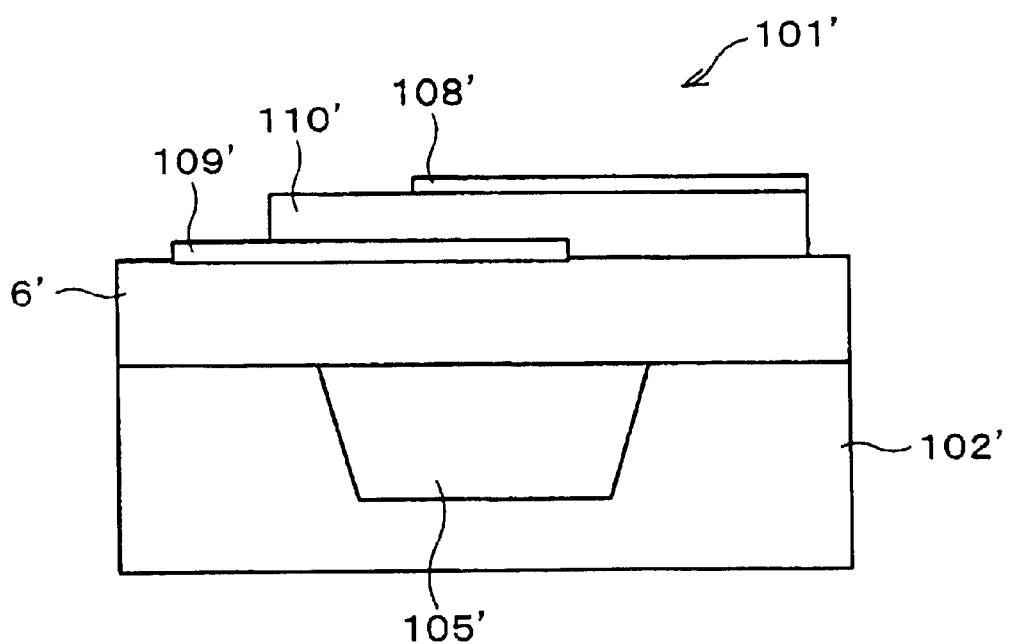
FIG. 11 is a cross-sectional view of an essential portion of a modification of the bulk acoustic wave resonator according to a preferred embodiment of the present invention.

A modification of the bulk acoustic wave resonator (piezoelectric thin-film resonator) has, e.g., the structure shown in FIG. 11. As shown in FIG. 11, the bulk acoustic wave resonator (piezoelectric thin-film resonator) 101' has the same constitution as the bulk acoustic wave resonator 101 except that a concave 105' is formed in an Si substrate 102' instead of the opening 105 formed in the Si substrate 102 of the bulk acoustic wave resonator 101.

Figure 12:
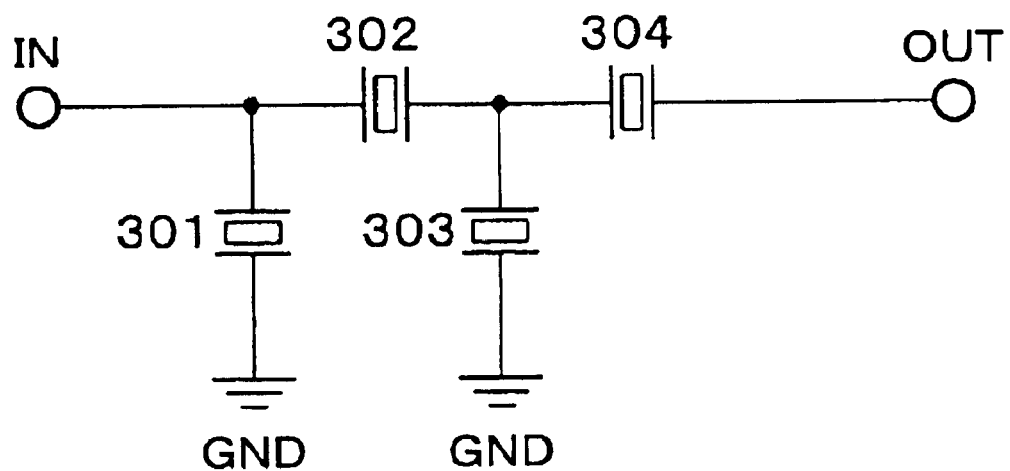
FIG. 12 is a circuit diagram of a modification of a transmission band filter for use in the duplexer according to a preferred embodiment of the present invention.
Figure 13:
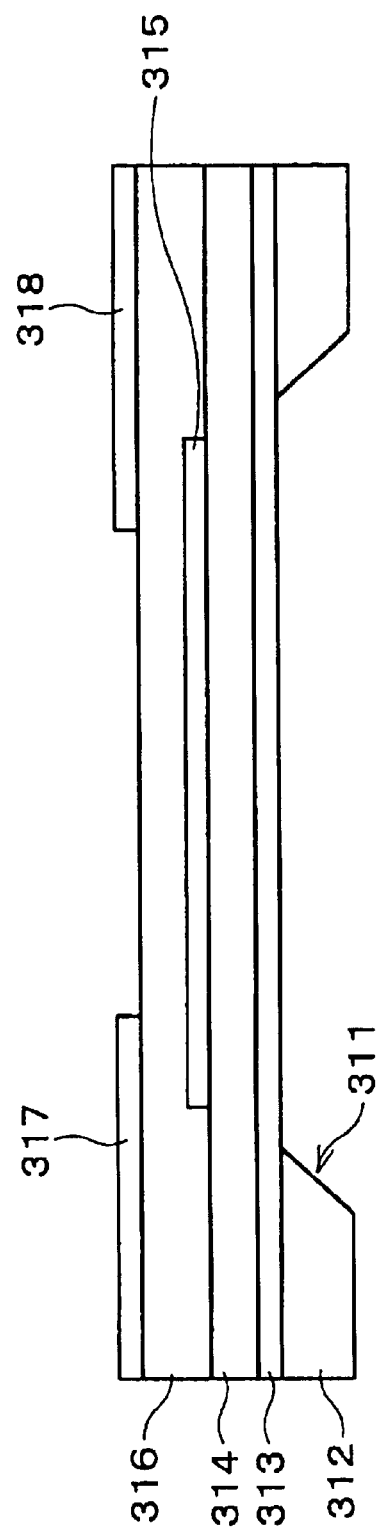
FIG. 13 is a cross-sectional view of an essential portion of an example of a bulk acoustic wave resonator for use in the transmission band filter of FIG. 12.
Figure 14:
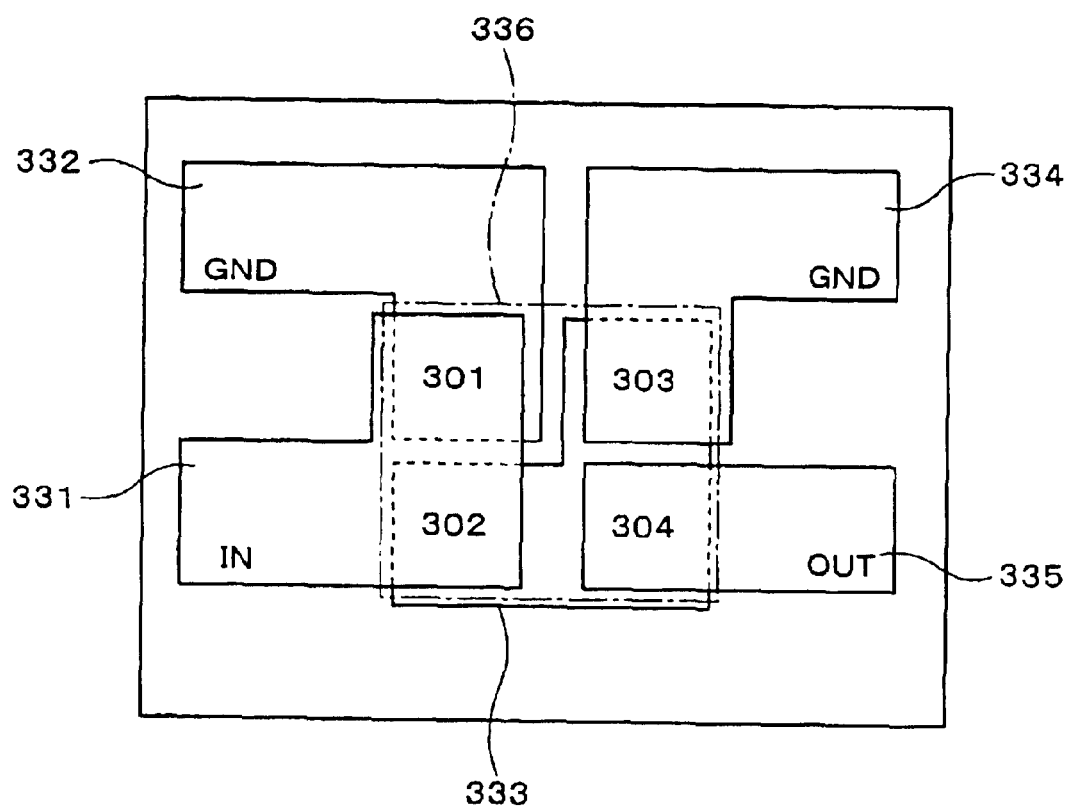
FIG. 14 is a plan view showing the configuration in which the transmission band filter of FIG. 12 is mounted on one chip.

Moreover, the bulk acoustic wave filter used as the transmission band filter has, e.g., the structure shown in FIG. 12, in which series-connected resonators 302 and 304 and parallel-connected resonators 301 and 303 are arranged in a ladder configuration. In this configuration, each of the resonators 301 to 304 includes a Si substrate 312 having an opening 311, an insulating film 313 of $SiO_2$ and an insulating film 314 of AlN formed on the Si substrate 312, as shown in FIG. 13. Moreover, the resonator further includes a lower electrode 315 of Al or other suitable material, a piezoelectric thin-film 316 of ZnO, and upper electrodes 317 and 318 of Al or other suitable material preferably formed on the insulating film 314 in that order. The transmission band filter including the resonators 301 to 304 may be formed as one chip in which the resonators 301 to 304 and the upper and lower electrodes of the respective resonators are arranged as shown in FIG. 14. In this configuration, the upper electrodes of the series-connected resonator 302 and the parallel-connected resonator 301 are integrated with each other to define an upper electrode 331. The lower electrode of the parallel-connected resonator 301 functions as GND 332. The lower electrodes of the series-connected resonators 302 and 304 and the parallel-connected resonator 303 are integrated with each other to define a lower electrode 333. The upper electrode of the parallel-connected resonator 303 functions as GND 334. The upper electrode of the series-connected resonator 204 functions as an upper electrode 335. The portion 336 surrounded by an alternate long and short dash line in FIG. 14 represents a diaphragm of the transmission band filter. One diaphragm is preferably provided in this transmission band filter. The piezoelectric thin-film 316 is omitted from FIG. 14.

Figure 15:
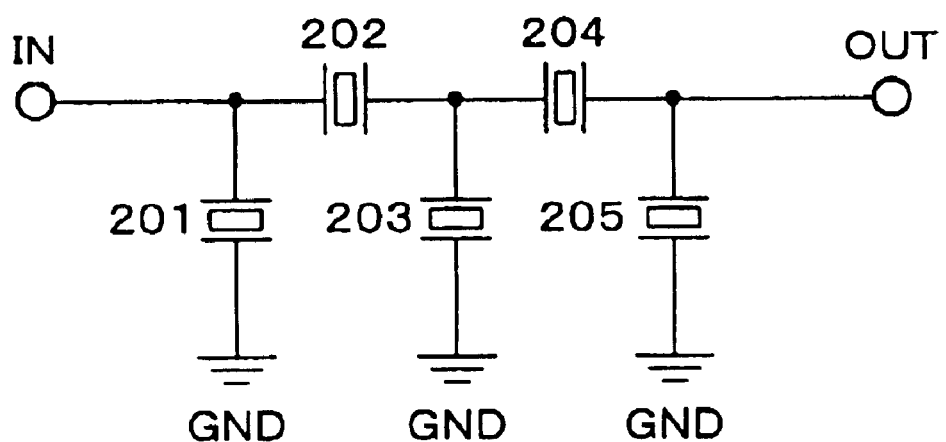
FIG. 15 is a circuit diagram of a modification of a reception band filter for use in the duplexer according to a preferred embodiment of the present invention.
Figure 16:
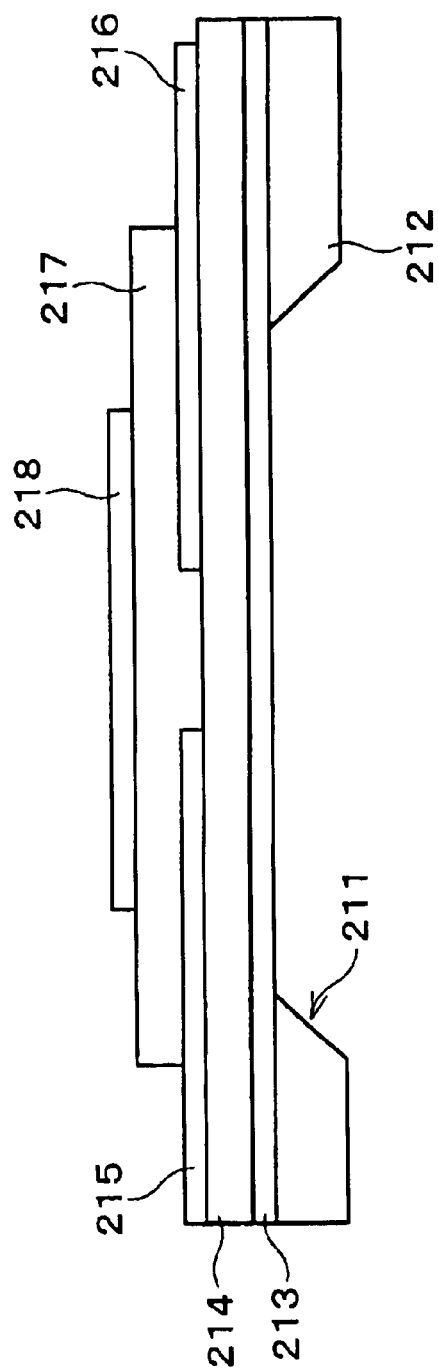
FIG. 16 is a cross-sectional view of an essential portion of an example of the bulk acoustic wave resonator for use in the reception band filter of FIG. 15.
Figure 17:
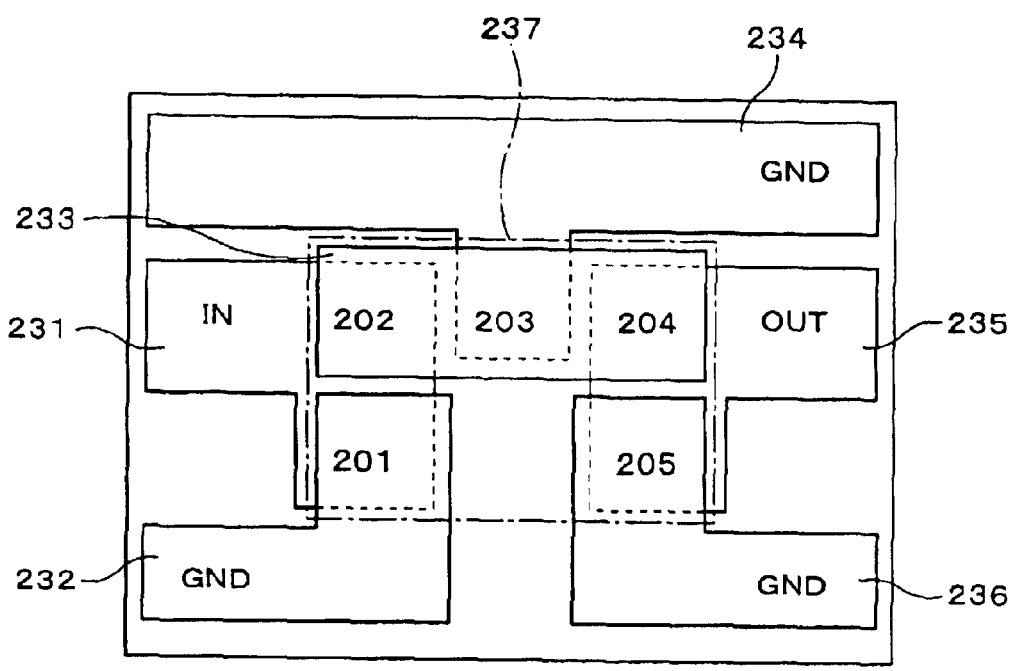
FIG. 17 is a plan view showing the configuration in which the reception band filter of FIG. 15 is mounted on one chip.

The bulk acoustic wave filter used as the reception band filter has, e.g., the configuration shown in FIG. 15, in which the series-connected resonators 202 and 204 and the parallel-connected resonators 201, 203, and 205 are arranged in a ladder configuration. In this configuration, for example, each of the resonators 201 to 205 includes a Si substrate having an opening 211, an insulating film 213 of $Al_2O_3$ and an insulating film 214 of $SiO_2$ formed on the Si substrate 212, as shown in FIG. 16. Moreover, the resonator further includes lower electrodes 215 and 216 of Al or other suitable material, a piezoelectric thin-film 217 of ZnO, and an upper electrode 218 of Al or other suitable material are formed on the insulating film 214 in that order. The reception band filter using the resonators 201 to 205 may be formed as one chip in which the resonators 201 to 205 and the upper and lower electrodes of the resonators are arranged as shown in FIG. 17. In this structure, the lower electrodes of the series-connected resonator 202 and the parallel-connected resonator 201 are integrated with each other to define a lower electrode 231. The upper electrode of the series-connected resonator 201 functions as GND 232. The upper electrodes of the series-connected resonators 202 and 204 and the parallel-connected resonator 203 are integrated with each other to define an upper electrode 233. The lower electrode of the parallel-connected resonator 203 functions as GND 234. The lower electrodes of the parallel-connected resonator 205 and the series-connected resonator 204 are integrated with each other to define a lower electrode 235. The upper electrode of the parallel-connected resonator 205 functions as GND 236. Moreover, the portion 237 surrounded by an alternate long and short dash line shown in FIG. 17 represents a diaphragm of the reception band filter. One diaphragm is preferably provided in this reception band filter. The piezoelectric thin-film 217 is omitted from FIG. 17.

Figure 18:
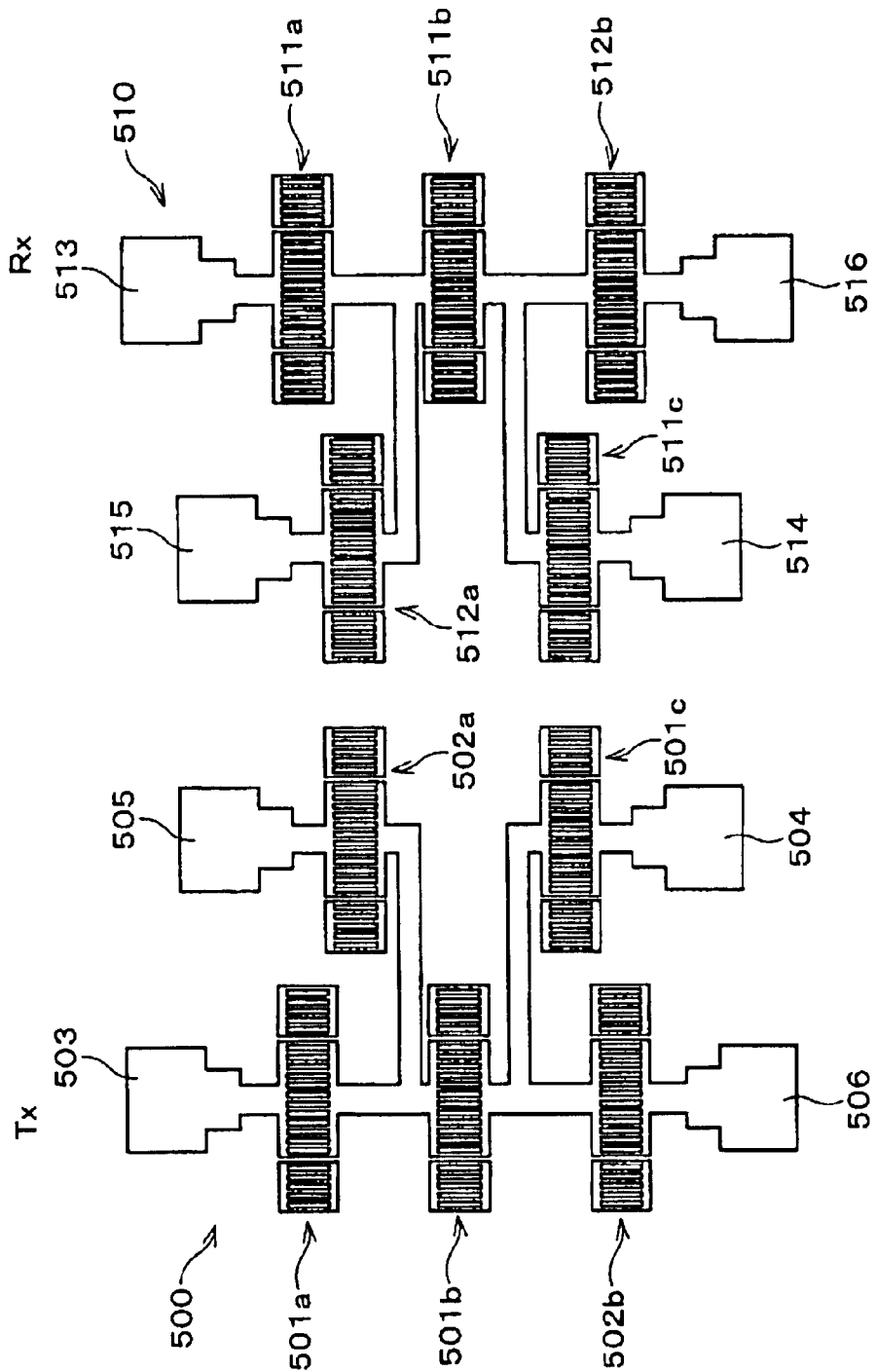
FIG. 18 schematically shows the configuration of a transmission band filter and a reception band filter for use in the duplexer according to a preferred embodiment of the present invention, each of the filters including surface acoustic wave resonators.

FIG. 18 illustrates surface acoustic wave filters which are used as the transmission band filter and the reception band filter.

As shown in FIG. 18, a reception band filter 500 includes series-connected surface acoustic wave resonators 501a to 501c and parallel-connected surface acoustic wave resonators 502a and 502b which are arranged in a ladder configuration on a piezoelectric substrate. Moreover, the series-connected surface acoustic wave resonators 501a to 501c are connected in series with each other between an input terminal 503 connected to the transmission terminal and an output terminal 504 connected to the antenna terminal. On the other hand, the parallel-connected surface acoustic wave resonator 502a and 502b are connected between GND electrodes 505, 506 and the series-connected resonators 501a, 501b, and 501c, respectively.

The reception band filter 510 includes series-connected surface acoustic wave resonators 511a to 511c and parallel-connected surface acoustic wave resonators 512a and 512b which are arranged in a ladder configuration. The series-connected surface acoustic wave resonators 511a to 511c are connected in series with each other between an input terminal 513 connected to the reception terminal and an output terminal 514 connected to the antenna terminal. On the other hand, the parallel-connected surface acoustic wave resonators 512a and 512b are connected between GND electrodes 515, 516 and the series-connected resonators 511a, 511b and 511c, respectively.

Each of the above-described surface acoustic wave resonators is preferably provided with an interdigital electrode portion, and two reflectors arranged so as to sandwich the interdigital electrode portion from the right and left sides thereof (from the right and left sides in the propagation direction of a surface acoustic wave).

Hereinafter, another preferred embodiment of the present invention will be described with reference to FIGS. 19 to 21. For convenience of explanation, members or parts having the same functions as those described in the first preferred embodiment are designated by the same reference numerals, and the description is not repeated.

Figure 19:
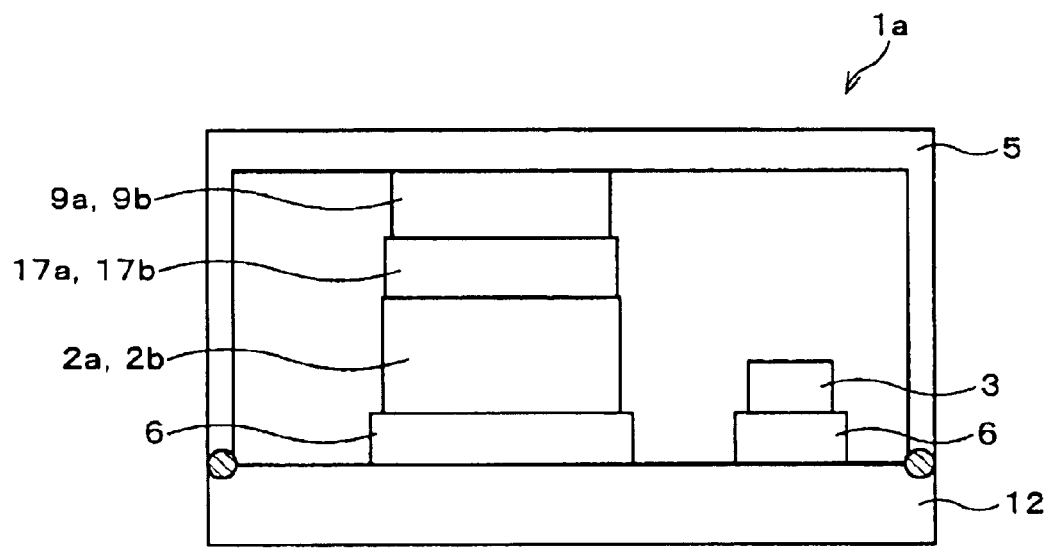
FIG. 19 is a cross sectional view and a plane view of an essential portion of a duplexer according to another preferred embodiment of the present invention.
Figure 19:
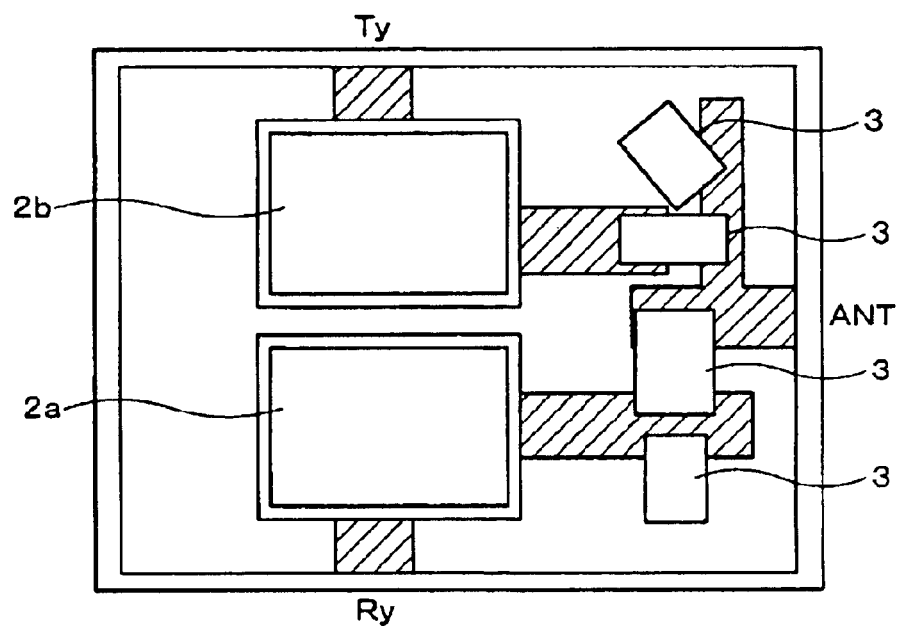

As shown in FIG. 19, a duplexer 1a of this preferred embodiment preferably has the same structure as that of the first preferred embodiment except that the transmission band filter and the reception band filter are included in separate packages 2a and 2b, respectively, instead of the package 2 of the first preferred embodiment. In particular, the duplexer of this preferred embodiment is provided with the transmission band filter package 2a and the reception band filter package 2b, which are connected to the shield 5 via lids 17a and 17b and moreover via connecting members 9a and 9b, respectively.

Figure 20:
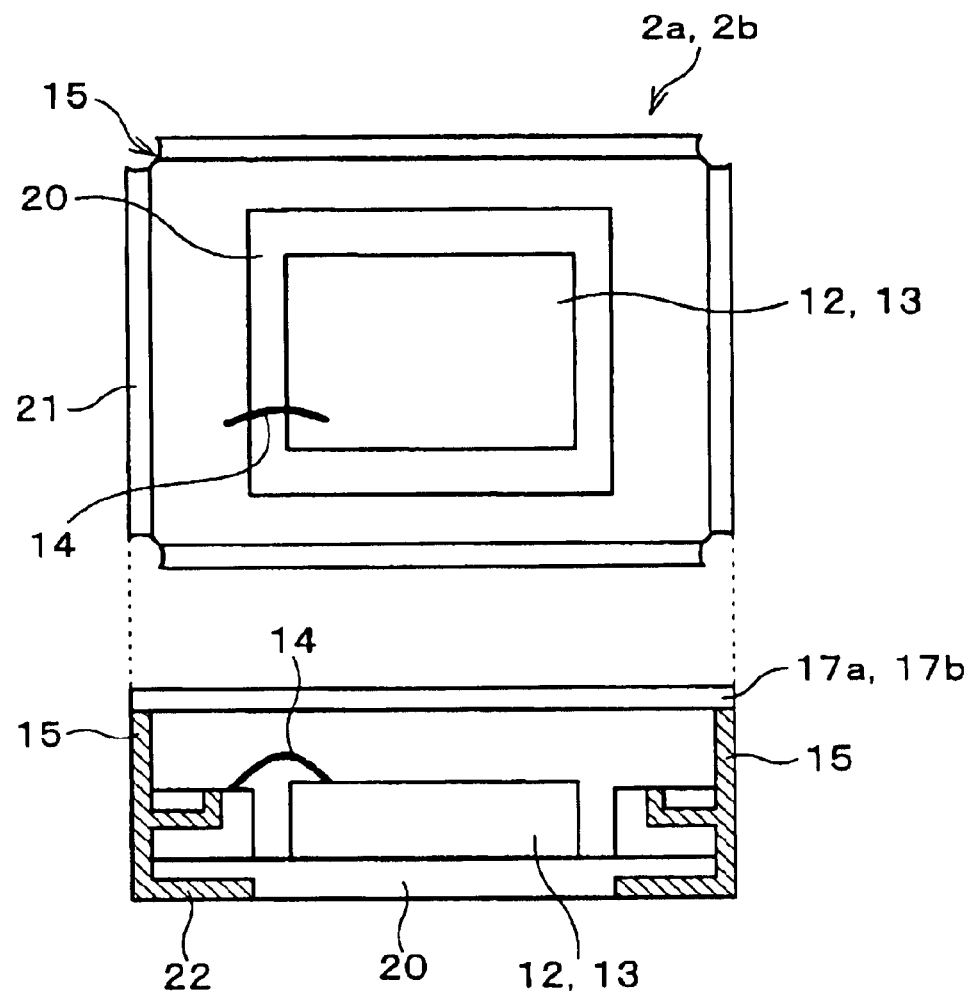
FIG. 20 is a plan view showing the configuration of a package in the duplexer and a cross-sectional view of an essential portion of the duplexer according to a preferred embodiment of the present invention.
Figure 21:
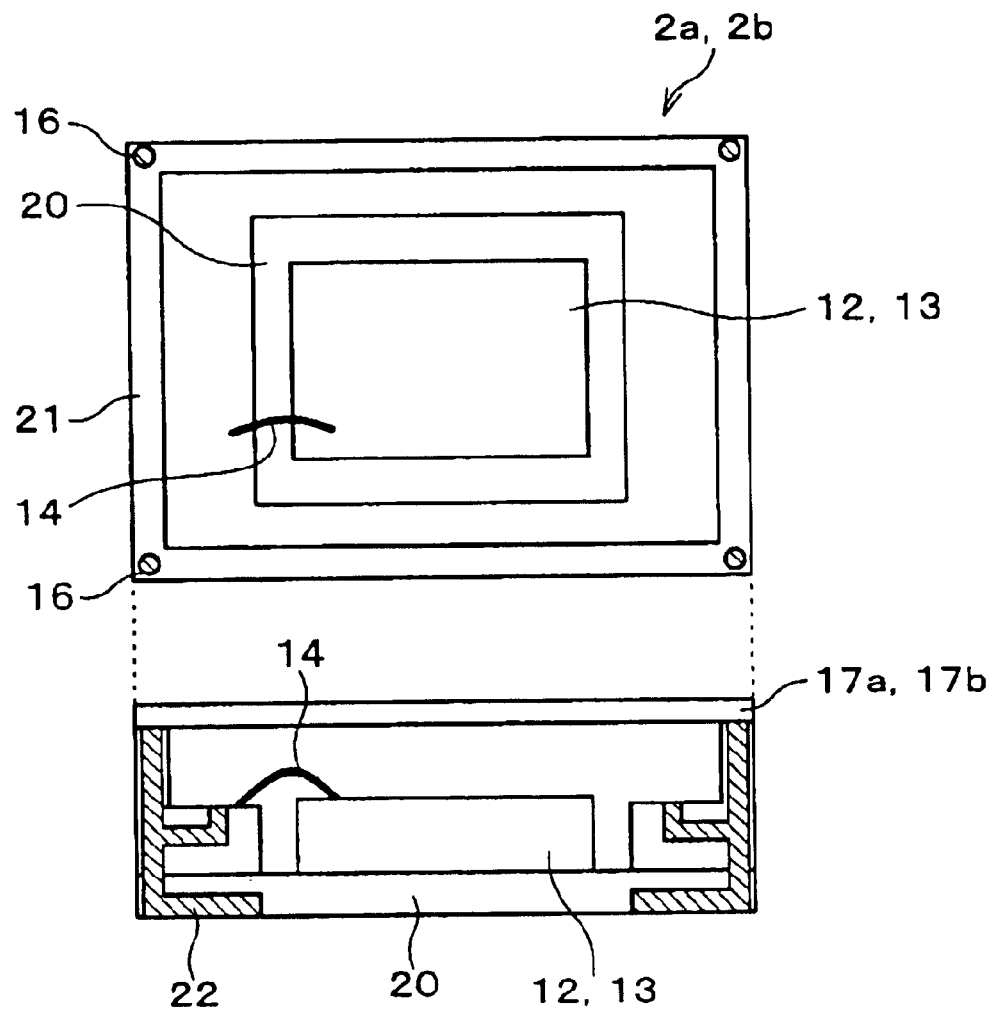
FIG. 21 is a plan view showing the configuration of a modification of the package in the duplexer, and a cross-sectional view of the essential portion of the duplexer according to a preferred embodiment of the present invention.

As shown in FIG. 20, the package 2a includes the transmission band filter 12, and the package 2b includes the reception band filter 13, which is different from the package 2 of the first preferred embodiment. As shown in FIG. 20, the electrical connection of the transmission band filter 12 to the lid 17a and that of the reception band filter 13 to the lid 17b are achieved by the castellations 15, respectively. Moreover, as shown in FIG. 21, the electrical connection of the transmission band filter 12 to the lid 17a and that of the reception band filter 13 to the lid 17b may be achieved by the through-holes 16, respectively. In the case of the packages 2a and 2b, one transmission band filter 12 and one reception band filter 13 are contained in the packages 2a and 2b, respectively. However, each of the filters 12 and 13 may include plural filters.

According to the above-described structures, the same advantages as those of the first preferred embodiment can be obtained.

Hereinafter, still another preferred embodiment of the present invention will be described with reference to FIG. 22. For convenience of explanation, elements or parts having the same functions as those described in the first and second preferred embodiments are designated by the same reference numerals, and the repeated description is omitted.

Figure 22:
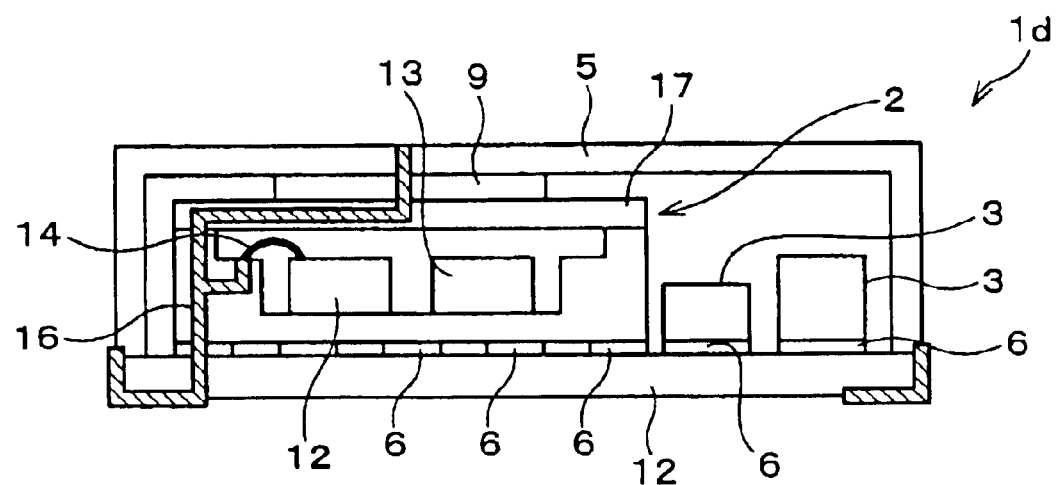
FIG. 22 is a cross-sectional view of a package in a duplexer according to still another preferred embodiment of the present invention.

As shown in FIG. 22, according to the structure of a duplexer 1d of this preferred embodiment, only one of the transmission band filter 12 and the reception band filter 13 has GND connected to the lid 17 and the shield 5, differently from the first and second preferred embodiments in which both of the transmission band filter 12 and the reception band filter 13 are connected to the lid 17 and the shield 5.

According to the above-described structure, the lid 17 and the shield 5 function as GND. Therefore, the GND of the transmission band filter 12 or the reception band filter 13 can be increased in area. Thus, the attenuation of the transmission band filter 12 or the reception band filter 13 can be increased. As a result, the characteristic of the duplexer can be enhanced.

The present invention is not restricted to the above-described preferred embodiments. Different modifications can be made within the range defined in the claims. Embodiments obtained by appropriate combination of the technical features disclosed in the different embodiments are also included in the technical range of the present invention.

Moreover, the above-described preferred embodiments relate to a duplexer. The present invention is not restricted to a duplexer. For a composite module having a structure in which at least one filter and a mounting member are mounted on a mounting substrate and covered with a shield, the same advantages can be obtained by electrical connection of the lid of the package containing the at least one filter to the shield.

The duplexer of the present invention can be applied to a communication device such as a portable telephone or other suitable apparatus.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A duplexer comprising:

a package;

a transmission band filter disposed in the package;

a reception band filter disposed in the package and connected in parallel to the transmission band filter and connected to an antenna terminal; and an electroconductive lid sealing the package with the transmission band filter and the reception band filter disposed therein; wherein the package is mounted on a mounting substrate having the antenna terminal and is covered with an electroconductive shield mounted on the mounting substrate;

at least one of the transmission band filter and the reception band filter has a ground terminal connected to the lid, the lid being electrically connected to the shield via a connecting member; and the transmission band filter and the reception band filter have ground terminals electrically connected to a ground terminal of the mounting substrate.

2. A duplexer according to claim 1, wherein the shield is electrically connected to the ground terminal of the mounting substrate.

3. A duplexer according to claim 1, further comprising a matching circuit provided between the antenna terminal and at least one of the transmission band filter and the reception band filter.

4. A duplexer according to claim 1, wherein the ground terminals of the transmission band filter and the reception band filter are connected to the lid.

5. A duplexer according to claim 1, wherein the transmission band filter and the reception band filter are one of a bulk acoustic wave filter and a surface acoustic wave filter.

6. A duplexer according to claim 1, wherein the transmission band filter and the reception band filter are a combination of a bulk acoustic wave filter and a surface acoustic wave filter.

7. A duplexer according to claim 1, wherein the lid and the shield define a ground.

8. A duplexer according to claim 1, wherein each of the transmission band filter and the reception band filter is electrically connected to the lid and the shield.

9. A duplexer comprising a transmission band filter and a reception band filter connected in parallel to each other end connected to an antenna terminal;

the transmission band filter and the reception band filter being accommodated in separate packages covered with electroconductive lids, respectively;

the packages being mounted on a mounting substrate having the antenna terminal and being covered with an electroconductive shield mounted on the mounting substrate;

at least one of the transmission band filter and the reception band filter having a ground terminal connected to the respective lid, the respective lid being electrically connected to the shield via a connecting member; and the transmission band filter and the reception band filter having ground terminals electrically connected to a ground terminal of the mounting substrate.

10. A duplexer according to claim 9, wherein the shield is electrically connected to the ground terminal of the mounting substrate.

11. A duplexer according to claim 9, further comprising a matching circuit provided between the antenna terminal and at least one of the transmission band filter and the reception band filter.

12. A duplexer according to claim 9, wherein the ground terminals of the transmission band filter and the reception band filter are connected to the respective lid.

13. A duplexer according to claim 9, wherein the transmission band filter and the reception band filter are one of a bulk acoustic wave filter and a surface acoustic wave filter.

14. A duplexer according to claim 9, wherein the transmission band filter and the reception band filter are a combination of a bulk acoustic wave filter and a surface acoustic wave filter.

15. A duplexer according to claim 9, wherein the shield and the respective lid that is electrically connected thereto define a ground.

16. A duplexer according to claim 9, wherein each of the transmission band filter and the reception band filter is electrically connected to the respective lid and the shield.

17. A composite module comprising at east one filter and a mounting portion;

the at least one filter being accommodated in at least one package covered with an electroconductive lid;

the at least one package being mounted on and joined to a mounting substrate via the mounting portion; and the at least one filter having a ground terminal connected to the lid, the lid being electrically connected to a shield via a connecting member, and the ground terminal of the at least one filter being electrically connected to a ground terminal of the mounting substrate.

18. A composite module according to claim 17, wherein the at least one filter is a duplexer.

* * * * *